United States Patent
Aschauer et al.

(10) Patent No.: US 10,983,157 B2
(45) Date of Patent: Apr. 20, 2021

(54) VERIFICATION OF SENSOR DATA

(71) Applicant: Siemens Aktiengesellschaft, München (DE)

(72) Inventors: Hans Aschauer, Munich (DE); Christian Peter Feist, Munich (DE); Axel Pfau, Munich (DE); Daniel Schneider, Munich (DE); Rainer Falk, Poing (DE)

(73) Assignee: SIEMENS AKTIENGESELLSCHAFT

( * ) Notice: Subject to any disclaimer, the term of this patent is extended or adjusted under 35 U.S.C. 154(b) by 53 days.

(21) Appl. No.: 16/250,192

(22) Filed: Jan. 17, 2019

(65) Prior Publication Data

US 2019/0227114 A1    Jul. 25, 2019

(30) Foreign Application Priority Data

Jan. 23, 2018   (EP) .................................. 18153025

(51) Int. Cl.
  *G01R 31/28* (2006.01)
  *G01D 3/08* (2006.01)
  *G01R 29/26* (2006.01)

(52) U.S. Cl.
  CPC ........... *G01R 31/2829* (2013.01); *G01D 3/08* (2013.01); *G01R 29/26* (2013.01)

(58) Field of Classification Search
  CPC ....... G01R 31/2829; G01R 29/26; G01D 3/08
  See application file for complete search history.

(56) References Cited

U.S. PATENT DOCUMENTS

| | | | |
|---|---|---|---|
| 2005/0038623 A1 | 2/2005 | Hammerschmidt | |
| 2005/0213755 A1 | 9/2005 | Daniels et al. | |
| 2008/0276092 A1 | 11/2008 | Eberhardt et al. | |
| 2009/0120810 A1 | 5/2009 | Phan et al. | |
| 2010/0250167 A1 | 9/2010 | Colinet et al. | |
| 2010/0259434 A1 | 10/2010 | Rud et al. | |
| 2011/0103583 A1* | 5/2011 | Yoon .................... | H04L 9/3093 380/255 |
| 2013/0226498 A1* | 8/2013 | Pedersen ............. | G06F 11/0781 702/117 |
| 2014/0140512 A1* | 5/2014 | Hadley .................. | H04L 9/088 380/277 |

(Continued)

FOREIGN PATENT DOCUMENTS

CN     101686805 A    3/2010
CN     102378917 A    3/2012

(Continued)

OTHER PUBLICATIONS

Russian Office Action dated Oct. 28, 2019 for Application No. 201910165313.

(Continued)

*Primary Examiner* — Yoshihisa Ishizuka
(74) *Attorney, Agent, or Firm* — Schmeiser, Olsen & Watts LLP

(57) ABSTRACT

Various embodiments disclosed help to implement integrity verification of sensors and signaling lines of the sensors. According to various embodiments, this is achieved by performing an analysis of a noise signal on the signaling line and transmitting check data indicative of a result of the analysis.

15 Claims, 5 Drawing Sheets

(56) References Cited

U.S. PATENT DOCUMENTS

| | | | |
|---|---|---|---|
| 2015/0006115 A1 | 1/2015 | Svoboda et al. | |
| 2017/0023630 A1* | 1/2017 | Zettler | G01R 31/2829 |
| 2019/0154743 A1 | 5/2019 | Zettler et al. | |

FOREIGN PATENT DOCUMENTS

| | | | | |
|---|---|---|---|---|
| CN | 203811341 | U | 9/2014 | |
| CN | 106370211 | A | 2/2017 | |
| CN | 106706118 | A | 5/2017 | |
| CN | 107305235 | A | 10/2017 | |
| DE | 10340793 | A1 | 4/2005 | |
| DE | 10362049 | A1 | 6/2005 | |
| JP | S57190212 | A | 11/1982 | |
| JP | H09281168 | A | 10/1997 | |
| JP | 2010161676 | A | 7/2010 | |
| JP | 2014150458 | A | 8/2014 | |
| JP | 2017097490 | A | 6/2017 | |
| KR | 101762534 | B1 | 7/2017 | |
| RU | 2145446 | C1 | 2/2000 | |
| RU | 1840539 | A1 | 5/2007 | |
| WO | 2014119279 | A1 | 8/2014 | |
| WO | WO-2017097930 | A1 * | 6/2017 | G06N 7/00 |

OTHER PUBLICATIONS

Gerdes, Ryan M., et al. "Device Identification via Analog Signal Fingerprinting: A Matched Filter Approach." NDSS. 2006; 2006.

"Sensor-Authentisierung anhand eines Rauschsignals" Journal Technik Up2date 2012 #19, pp. 13-14, ISBN: 978-3-942905-45-9; vol. No.: 99, Sep. 17, 2012; 2012.

Formby, David, et al. "Who's in Control of Your Control System? Device Fingerprinting for Cyber-Physical Systems." NDSS 2016; 2016.

European Search Report dated Jul. 5, 2018 for Application No. 1815325.4.

Canadian Office Action dated Jan. 24, 2020 for Application No. 3,030,842.

Japanese Office Action dated Aug. 4, 2020 for Application No. 2019-005171.

* cited by examiner

VERIFICATION OF SENSOR DATA

This application claims priority to European application No. EP 18153025.4, having a filing date of Jan. 23, 2018, the entire contents of which are hereby incorporated by reference.

FIELD OF TECHNOLOGY

Various embodiments of the invention generally relate sensor readout. Various embodiments of the invention specifically relate to verification of sensor data of the sensors based on a noise signal.

BACKGROUND

Sensors are used to measure various physical observables, e.g., temperature, pressure, flow, voltage, current, power, phase, energy, etc. An associated measurement value can be transmitted to a control unit using a sensor signal. The sensor signal is indicative of one or more measurement values. The sensor signal can be analog or digital. To transmit the sensor signal, a signaling line can be used. The signaling line can be wired or wireless.

There is a risk of damage, data loss, etc. if the sensor signal is manipulated. For example, in connection with automated fabrication, there is a need to avoid such attack vectors relying on manipulation of sensor signals. Hence, for implementing reliable operation of a system based on the sensor signal, there is a need for protecting the sensor signal against manipulation. For example, reference techniques are known in which digitally encoded sensor signals are protected by cryptographic techniques. Such techniques are not easily applicable to analog sensor signals.

"Sensor-Authentisierung anhand eines Rauschsignals" Journal Technik Up2date 2012 #19, Pages 13-14, ISBN: 978-3-942905-45-9; Volume No.: 99, 17 Sep. 2012 discloses checking a sensor signal based on a noise signal.

US 2005/0213755 A1 discloses observing an analog signal associated with communications from a digital device and providing a security feature based on characterizing the digital device at least partially based on the analog system. The security feature can be an intrusion detection security feature.

Formby, David, et al. "Who's in Control of Your Control System? Device Fingerprinting for Cyber-Physical Systems." *NDSS* 2016 discloses checking a device fingerprint for power networks and industry devices. The physical impact of an actuator onto the power network is detected and analyzed.

Gerdes, Ryan M., et al. "Device Identification via Analog Signal Fingerprinting: A Matched Filter Approach." *NDSS*. 2006 discloses identifying a network device for digital communication based on its analog signal properties.

Such reference techniques face certain restrictions and drawbacks. For example, according to such reference implementations, hardware may be required at the control unit and/or the sensors to implement the verification functionality. This may complicate the system and may limit the ability to retrofit verification functionality. Further, the flexibility of employing the verification functionality in various use cases may be limited.

SUMMARY

An aspect relates to advanced techniques of sensor readout including verification functionality. Specifically, a need exists for techniques which overcome or mitigate at least some of the above-identified restrictions or drawbacks.

A method includes establishing a noise signal. The noise signal is on a signaling line of the sensor. The method also includes performing an analysis of the noise signal. The method also includes transmitting check data indicative of a result of the analysis.

A computer program product (non-transitory computer readable storage medium having instructions, which when executed by a processor, perform actions) or computer program includes program code. The program code can be executed by control circuitry. Executing the program code causes the control circuitry to perform a method which includes establishing a noise signal. The noise signal is on a signaling line of the sensor. The method also includes performing an analysis of the noise signal. The method also includes transmitting check data indicative of a result of the analysis.

For example, the check data may be transmitted to a control unit. The control unit may be configured to process a sensor signal provided by the sensor on the signaling line. This may facilitate taking appropriate countermeasures at the control unit.

Alternatively or additionally, the check data may be transmitted to a server of a backend system, e.g., via the Internet. This may facilitate taking global countermeasures, e.g., adding the modified sensor or system to a blacklist, etc.

For example, the method may be performed by an analysis unit, e.g., by control circuitry of the analysis unit. The analysis unit may be physically distinct or remote from the control unit. In other examples, the analysis unit may be co-located with the control unit.

The transmitting of the check data may be implemented on a control signaling line established between, e.g., the control unit and the analysis unit. The control signaling line may be implemented using wireless communication and/or fixed-wire communication.

By transmitting the check data indicative of the result of the analysis, it becomes possible to separately implement the analysis of the noise signal and the processing of the sensor signal, e.g., using the control unit and the analysis unit. This helps to retrofit such verification functionality. It may not be required to modify the control unit.

The noise signal may be different from the sensor signal. For example, a superimposed signal may include, both, the noise signal and the sensor signal. The superimposed signal may be present on the signaling line. For example, the noise signal may reduce a signal-to-noise ratio of the sensor signal. For example, the noise signal may occupy a spectrum different from, overlapping with, or coincident with the sensor signal.

The noise signal may be at least partly random or pseudorandom. The noise signal may be generated from environment interaction between the sensor and an environment of the sensor. The noise signal may be generated using a signal generator. For example, a white noise signal or a spread spectrum noise signal may be used which includes spread out spectral components. The noise signal may be also referred to as a integrity fingerprint of the sensor signal: This may be because verification of the sensor signal becomes possible based on the noise signal, i.e., checking if manipulation of the sensor signal—e.g., due to manipulation of the sensor and/or the signaling line—occured.

The check data may include a cryptographic key. The cryptographic key may be required for processing the sensor signal.

According to various examples, different techniques of establishing the noise signal are conceivable. In a first example, the establishing of the noise signal includes detecting the noise signal using readout such as inductive readout of the signaling line. For example, the inductive readout may include detection of a stray electromagnetic field of the signaling line. For this, inductive windings may be brought into close proximity of the signaling line, so as to detect the electromagnetic stray field. Again, this facilitates retrofit, because it may not be required to modify the integrity of the signaling line; rather, external readout becomes possible.

Alternatively or additionally, in a further example, the establishing of the noise signal includes receiving control data digitally encoding the noise signal. For example, the control data may be received from the control unit. For example, the control unit may be configured to separate the noise signal from the sensor signal, based on the superimposed signal. This may be implemented in connection with noise cancellation. Then, the control unit may digitally encode the noise signal, e.g., using a multi-bit indicator indicative of the noise signal. In such a scenario, the hardware implementation may be simplified, because it may not be required to provide separate hardware for the readout of the noise signal. Rather, an analog-digital-converter of the control unit may be re-used for, both, converting the sensor signal and converting the noise signal into digital domain.

The method may further include performing a classification of a result of the analysis of the noise signal with respect to a plurality of categories. Then, the check data may be indicative of the classification. A respective codebook using a predefined mapping may be employed for the check data.

Such techniques are based on the finding that the result of the analysis may be provided at different levels of detail. For example, in a simple scenario, the check data may be indicative of whether the result of the analysis is indicative of modification of the sensor and/or the signaling line, i.e., whether the result of the analysis is indicative of a breach of integrity. This may be implemented with a 1-bit YES/NO flag. The level of detail is low. In more complex scenarios, a larger information depth at a higher level of detail may be provided. Here, it would be possible that the result of the analysis is indicative of additional information associated with the verification functionality of the sensor signal, beyond the mere indication of whether modification has or has not occured. In such a scenario, it may be helpful to perform the classification of the result of the analysis with respect to the plurality of categories, to thereby facilitate taking of the appropriate countermeasure at the control unit. Different countermeasures may be appropriate depending on the type of modification. For example, they may be less severe and more severe categories which may necessitate different actions to be taken at the control unit. Example categories include: manipulation of the sensor; manipulation of the signaling line; low-severity manipulation; high-severity manipulation; failure of the sensor; and failure of the signaling line.

In further examples, the classification may be indicative of different kinds and type of manipulation. For example, manipulation of the firmware, of function calls, of memory read addresses or memory write addresses, of a communication protocol or communication interface, etc. may all be covered by appropriate categories based on which the classification of the result of the analysis operates.

Here, it may be possible to distinguish between external manipulation on the one hand side, and intrinsic failure on the other hand side. It may be possible to judge the severity of the failure, e.g., in terms of self-contained failures or propagating failures. This helps to take tailored countermeasures.

According to some examples, configuration data indicative of a configuration of a signal generator may be received. The signal generation may be configured to generate the noise signal. Then, the establishing of the noise signal and/or the performing of the analysis may be based on the configuration data.

By such techniques, a synchronization between the signal generator for generating the noise signal on the one hand side and the analysis unit for performing the analysis of the noise signal may be achieved. This may help to discriminate the noise signal from the sensor signal. For example, the noise signal may be reliably established, e.g., by separating the noise signal from the superimposed signal including, both, the noise signal and the sensor signal.

Here, it would be possible that the configuration of the signal generator includes the signal level of the noise signal. Alternatively or additionally, the configuration may include the frequency spectrum of the noise signal. This may help to tailor the analysis to the particular signal properties expected for the noise signal.

In some examples, the analysis may include a comparison of the noise signal with a predefined reference signal. For example, a time-domain correlation may be implemented between the noise signal and the reference signal.

Alternatively or additionally, the analysis may include an anomaly detection. This may involve machine learning techniques. For example, a classification algorithm may be trained using machine learning techniques. Then, based on this classification algorithm, anomalies may be detected which are indicative of modification of the sensor and/or the signaling line.

Alternatively or additionally, the analysis may include a spectral analysis. Here, for example, a spectral power density may be determined for different spectral components of a superimposed signal including, both, the noise signal and the sensor signal. Then, based on the power spectral density, it may be judged whether there has been a modification of the sensor and/or the signaling line.

In general, such techniques of the analysis are known in the art and may be readily applied in the scenario described herein. Hence, there is no need to provide further details with respect to the analysis at this point.

A method includes receiving a sensor signal on a signaling line of a sensor. The method also includes receiving check data. The check data is indicative of a result of an analysis of a noise signal on the signaling line. The method also includes selectively processing the sensor signal depending on the check data.

A computer program product or computer program includes program code. The program code can be executed by control circuitry. Executing the program code causes the control circuitry to perform a method which includes receiving a sensor signal on a signaling line of a sensor. The method also includes receiving check data. The check data is indicative of a result of an analysis of a noise signal on the signaling line. The method also includes selectively processing the sensor signal depending on the check data.

For example, the method may be executed by a control unit, e.g., by a control circuitry of the control unit. The control unit may include an input interface. For example, the input interface may include a analog-digital-converter, in a scenario in which the sensor signal is communicated in analog domain on the signaling line. In other scenarios, it would also be possible that the sensor signal is communicated in digital domain on the signaling line. Here, the sensor signal may digitally encode measurement values of the sensors. In such a scenario, the sensor may include an analog-digital-converter.

It would be possible that the sensor signal is included in a superimposed signal; the superimposed signal may include, both, the sensor signal and the noise signal. Then, according to certain techniques, noise cancellation may be implemented in order to extract the sensor signal. Noise cancellation may generally refer to a technique of separating the sensor signal from the noise signal. Here, according to certain implementations, residual contributions of the noise signal may be retained in the sensor signal, thereby defining a signal-to-noise ratio of the sensor signal.

The check data may be received from an analysis unit. The analysis unit may be remote from and/or separately implemented from the control unit. Thereby, retrofitting of the verification functionality may be facilitated.

For example, if the check data is indicative of a breach of integrity of the sensor signal, processing of the sensor signal may not be implemented and/or aborted. Differently, if the check data is not indicative of modification of the sensor signal, then processing of the sensor signal may be executed, continued, or commenced.

Again, it would be possible that the check data is indicative of a classification of the result of the analysis with respect to a plurality of categories. Then, depending on the particular classification, different actions with respect to the processing of the sensor signal may be taken. For example, the sensor signal may be processed in different manners, depending on the classification.

According to certain scenarios, the noise signal may be detected; this may be implemented as part of the noise cancellation when separating the sensor signal from the noise signal based on the superimposed signal. Then, the method may further include transmitting control data which digitally encodes the noise signal, e.g., to the analysis unit. This may help to simplify a hardware architecture, because it may not be required to implement separate read out of the signaling line associated with the analysis of the noise signal.

For example, the check data may include a cryptographic key. Then, the sensor signal may be processed based on the cryptographic key. Such an implementation may help to effectively suppress processing of the sensor signal if the breach of integrity is detected based on the analysis of the noise signal. This may mitigate respective attack vectors.

Alternatively or additionally, it would be possible to delete a cryptographic key associated with said processing of the sensor signal, based on the result of the analysis. Again, this helps to effectively prevent the sensor signal from being processed in case a breach of integrity is detected. Such techniques may be referred to as zeroisation. Attack vectors may be mitigated.

According to an example, a method includes operating a signal generator to generate a noise signal. The method may further include feeding the noise signal to a signaling line of a sensor.

A computer program product or computer program includes program code. The program code can be executed by control circuitry. Executing the program code causes the control circuitry to perform a method which includes operating a signal generator to generate a noise signal. The method may further include feeding the noise signal to a signaling line of a sensor.

The method may optionally include: feeding a sensor signal of the sensor to the signaling line. Thereby, a superimposed signal may be obtained which includes, both, the noise signal, as well as the sensor signal.

For example, the method may include setting a configuration of the signal generator based on a sensor signal of the sensor. By means of the configuration of the signal generator, interference between the sensor signal and the noise signal may be mitigated. For example, the signal level of the noise signal and/or the frequency spectrum of the noise signal may be set appropriately by means of the configuration. Thereby, it would be possible to implement frequency division duplexing techniques, in order to facilitate noise cancellation at a corresponding control unit.

Configuration data indicative of the configuration of the signal generator may be transmitted. For example, the configuration data may be transmitted to the control unit, to thereby facilitate noise cancellation at the control unit. Alternatively or additionally, the configuration data may be transmitted to an analysis unit configured to analyze the noise signal, to thereby verify the sensor signal. Providing the configuration data indicative of the configuration may help to implement the analysis of the noise signal.

The signal generator may be operated to generate the noise signal based on a cryptographic key. For example, the cryptographic key may be received from the analysis unit. Thereby, an attack vector including modification of the generation of the noise signal may be mitigated.

An analysis unit includes control circuitry configured to establish a noise signal on a signaling line of a sensor. The control circuitry is also configured to perform an analysis of the noise signal and to transmit check data indicative of a result of the analysis.

A control unit includes control circuitry configured to perform receiving a sensor signal on a signaling line of a sensor. The control circuitry is further configured to receive check data. The check data is indicative of a result of an analysis of a noise signal on the signaling line. The control circuitry is also configured to selectively process the sensor signal, depending on the check data.

A sensor includes control circuitry configured to perform operating a signal generator to generate a noise signal. The method may further include feeding the noise signal to a signaling line of a sensor.

It is to be understood that the features mentioned above and those yet to be explained below may be used not only in the respective combinations indicated, but also in other combinations or in isolation without departing from the scope of the invention.

BRIEF DESCRIPTION

Some of the embodiments will be described in detail, with references to the following Figures, wherein like designations denote like members, wherein:

FIG. 1 schematically illustrates a system including a sensor, a control unit, and an analysis unit according to various examples;

Figure 7:
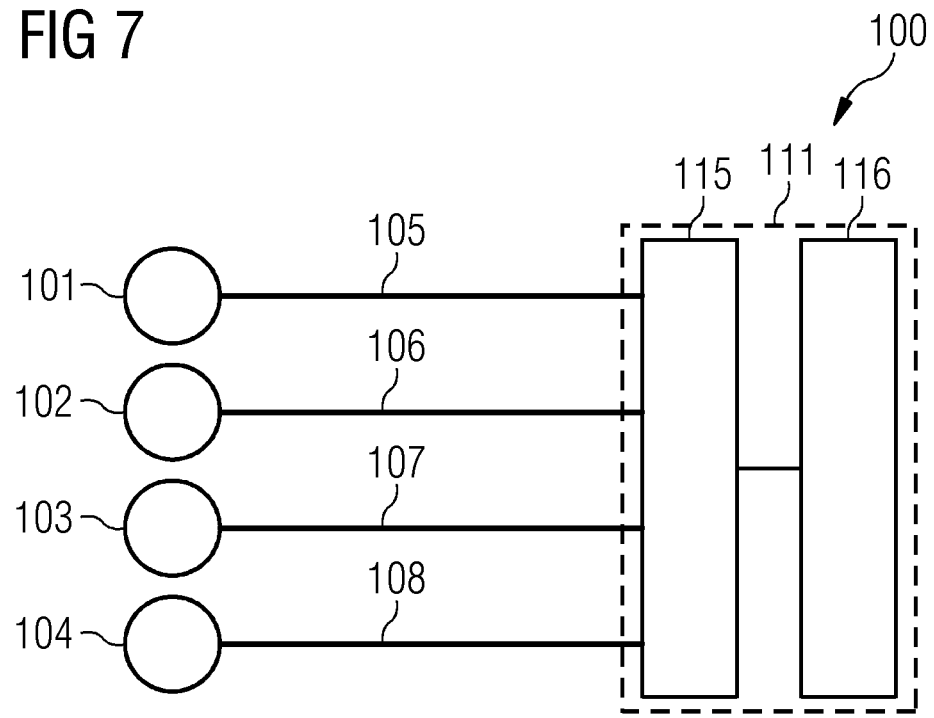
Figure 8:
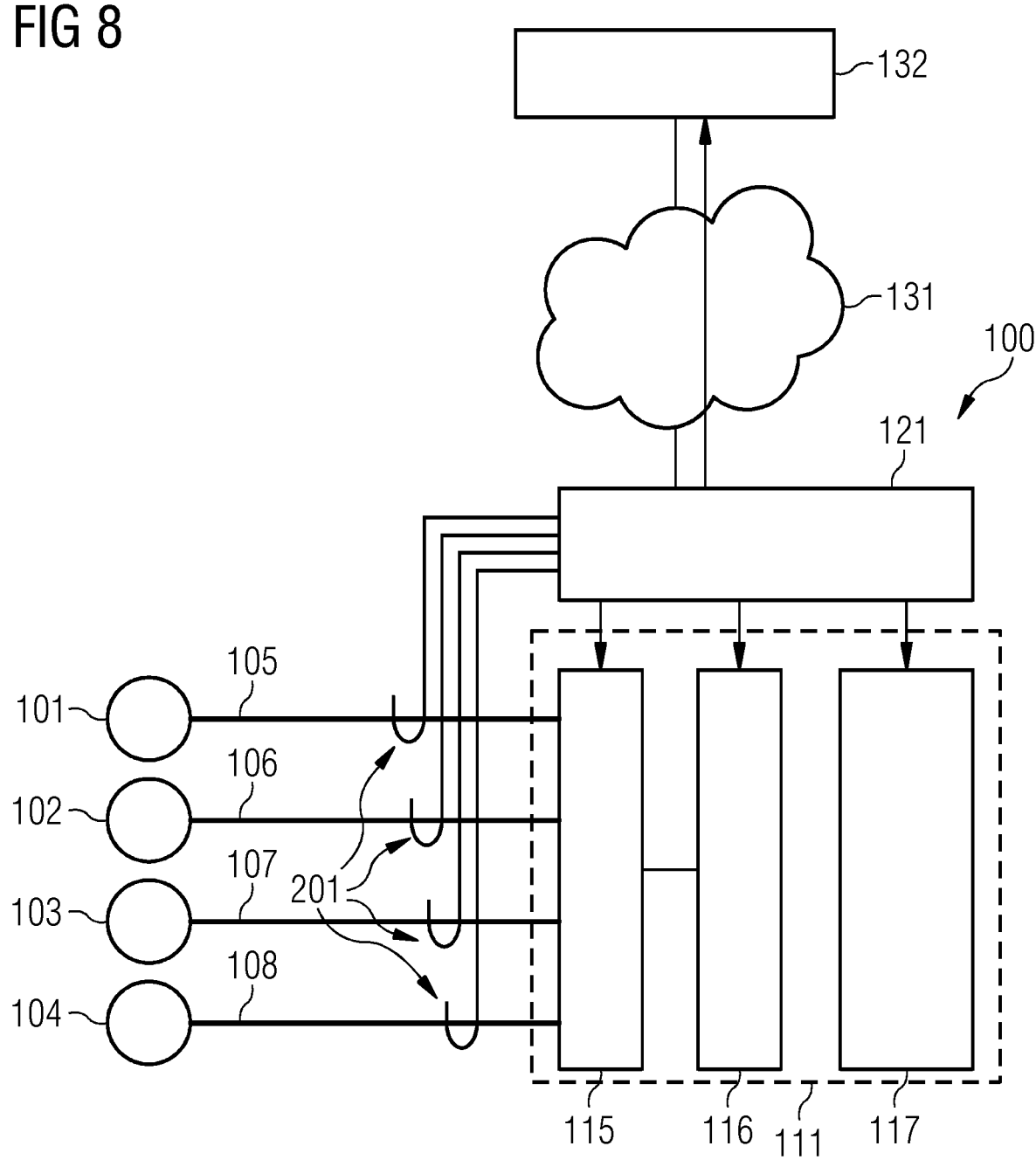
Figure 9:
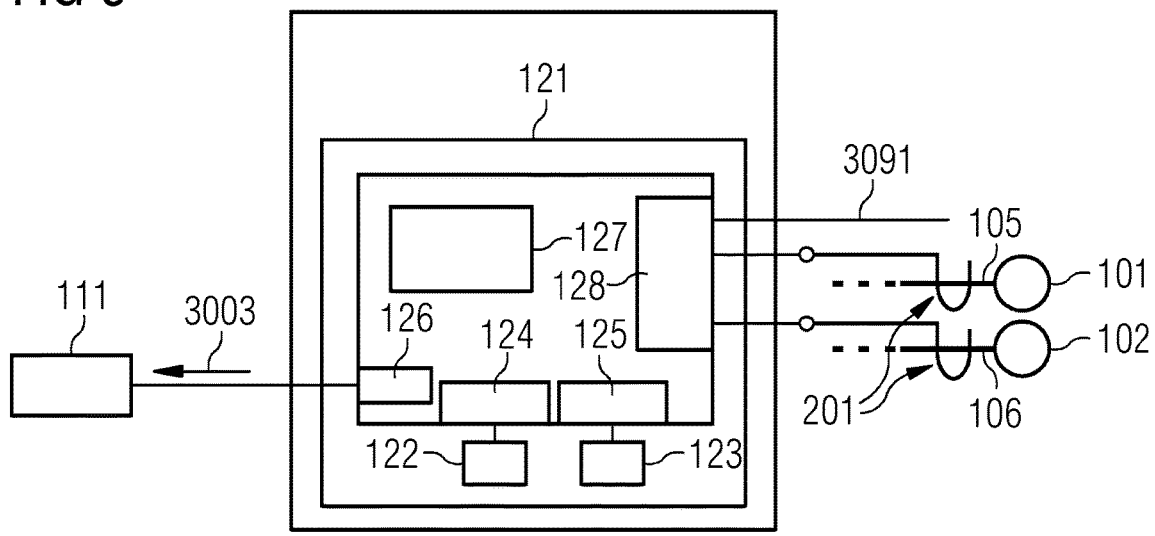
Figure 10:
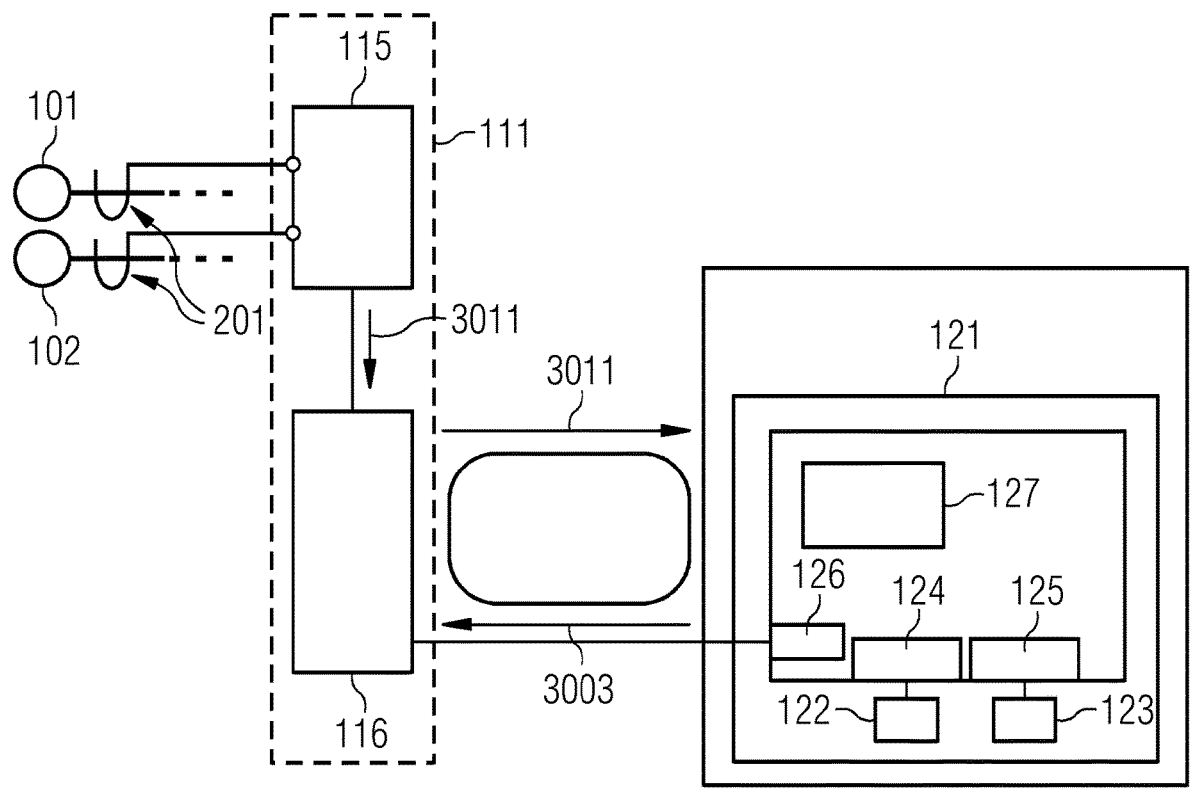

FIG. 7 schematically illustrates a system according to reference implementations;

FIG. 8 schematically illustrates a system including a sensor, a control unit, and an analysis unit according to various examples;

FIG. 9 schematically illustrates the analysis unit according to various examples; and FIG. 10 schematically illustrates the control unit and the analysis unit according to various examples.

DETAILED DESCRIPTION

In the following, embodiments of the invention will be described in detail with reference to the accompanying drawings. It is to be understood that the following description of embodiments is not to be taken in a limiting sense. The scope of the invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Hereinafter, techniques of verifying a sensor signal are described. A breach of integrity can be detected. This helps to mitigate attack vectors which include modification of a sensor and/or a signaling line of the sensor. The sensor may thereby be connected to a control unit for processing the sensor signal in a protected manner.

According to examples, a noise signal on the signaling line of the sensor is established. This may include extraction of the sensor signal from a superimposed signal which includes, both, the sensor signal and the noise signal. Then, an analysis unit—which may be separate from a control unit for processing the sensor signal—may perform an analysis of the noise signal. Based on a result of the analysis, check data can be transmitted from the analysis unit and then received by the control unit. The control unit may then selectively process the sensor data, based on the check data.

Thereby, it is possible to check if the sensor and/or the sensor line have been manipulated and/or experience failure. Specifically, by relying on the analysis unit, retrofit of verification functionality becomes possible, typically without a need of significant modifications of the sensor and the control unit.

For example, the analysis may include comparison of the noise signal with a reference signal; if deviation of the noise signal from the reference signal is detected, then, the check data may trigger a warning.

As a general rule, various countermeasures can be implemented in connection with the verification functionality. For example, a human machine interface may be controlled to display a warning message. Alternatively or additionally, the affected sensor may be decoupled such that the sensor may be detected as "not present" or in a failure state. The control unit can take appropriate countermeasures, e.g., activate a safe state or automatic shutdown in a self-contained operational mode. Alternatively or additionally to such warnings, the control data may abort processing of the sensor data in case a modification of the sensor and/or the signaling line has been detected. This helps to avoid processing of unreliable, modified measurement values included in the sensor data.

As a general rule, the scenarios described herein may find application in various use cases. For example, the sensors may be used for control of an automated system such as a power plant, turbine, a generator, a windmill, a railroad engine, a industry 2.0 fabrication facility, a people mover, medical equipment such as medical imaging apparatuses, etc. The scenarios described herein may facilitate safe operation of such automated systems based on trusted sensor signals. The trust level of the sensor signals may be increased by the integrity verification described herein.

Figure 1:
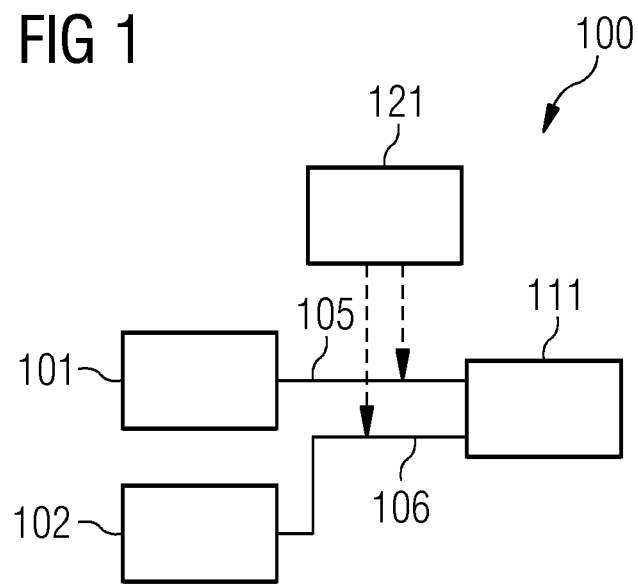

FIG. 1 schematically illustrates aspects with respect to a system 100 including multiple sensors 101, 102. In some examples, the system 100 may only include a single sensor or more than two sensors.

According to the various techniques described herein, a sensor may be configured to measure a physical observable. Different physical observables may be measured, e.g., temperature, pressure, acceleration, etc. Different sensors of the system 100 may measure different physical observables or the same physical observable.

The sensors 101, 102 are coupled via signaling lines 105, 106 with a control unit 111.

The control unit 111 may include control circuitry. For example, the control circuitry may be implemented using one or more of a micro processor, a field-programmable array (FPGA), and an application-specific integrated circuit (ASIC). The control unit 100 may also include an interface configured to receive sensor signals from the sensors 101, 102 on the signaling lines 105, 106.

The sensor signal may be indicative of the respective measurement value, e.g., a time-evolution of the measurement value. The sensor signal may be provided in digital domain or analog domain.

The signaling lines 105, 106 may be implemented as fixed-wire connections and/or wireless connections.

The system 100 also includes an analysis unit 121.

Again, the analysis unit 121 may include control circuitry, e.g., implemented by a micro processor, an FPGA, or an ASIC. The analysis unit 121 may include an interface configured for communicating with the control unit 111. The analysis unit 121 may be configured to perform an analysis of a noise signal of the signaling lines 105, 106. To establish the noise signal at the analysis unit 121, different techniques are conceivable. In one scenario, the analysis unit 121 may detect the noise signal using readout of the signaling lines 105, 106, e.g., inductive readout (illustrated by the dashed arrows in FIG. 1). In other scenarios, it would be possible that the noise signal is established by receiving control data digitally encoding the noise signal from the control unit 111.

Then, based on the analysis of the noise signal, check data can be transmitted by the analysis unit 121 and received by the control unit 111. The check data can be indicative of a result of the analysis.

Thereby, it becomes possible to take appropriate countermeasures, if need be, at the control unit 111, e.g., if the result of the analysis is indicative of a breach of integrity of the sensor signal due to modification of the sensors 101, 102 and/or the signaling lines 105, 106.

For example, the control unit 111 may or may not process the sensor signal, depending on the check data.

Figure 2:
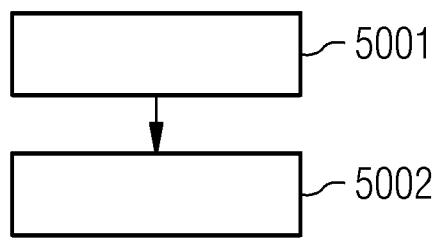
FIG. 2 is a flowchart of a method according to various examples.
Figure 3:
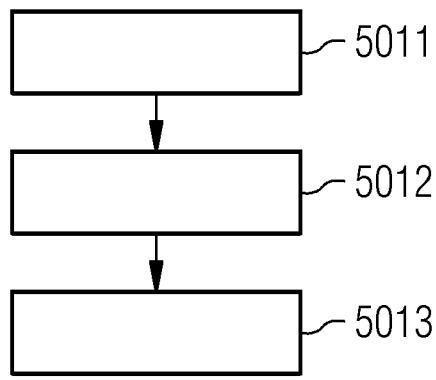
FIG. 3 is a flowchart of a method according to various examples.
Figure 4:
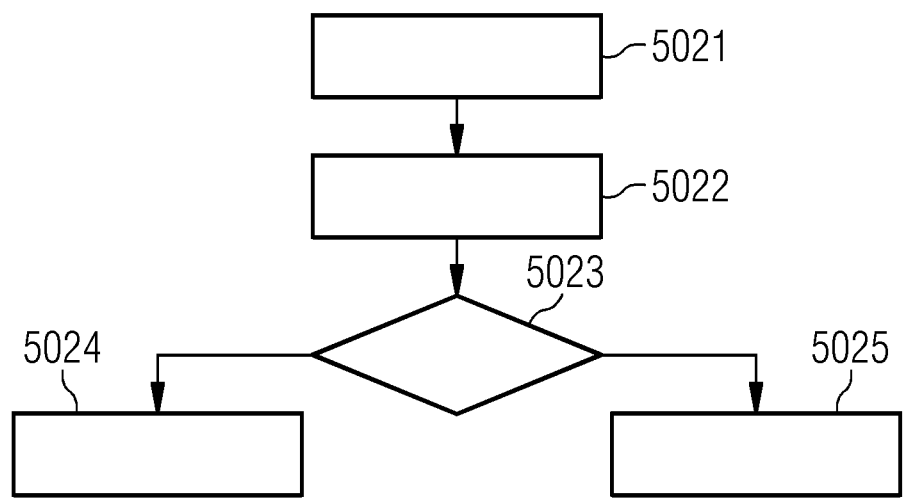
FIG. 4 is a flowchart of a method according to various examples.

The verification functionality provided by the system 100 is explained in greater detail with respect to FIGS. 2-4. FIGS. 2-4 illustrate aspects of the logic performed by the sensors 101, 102, the analysis unit 121, and the control unit 111.

FIG. 2 is a flowchart of a method according to various examples. For example, the method according to FIG. 2 may be executed by one of the sensors 101, 102 according to the example of FIG. 1, e.g., by a respective control circuitry. FIG. 2 illustrates aspects with respect to generating a noise signal.

In the scenario of FIG. 2, at block 5001, a signal generator is operated to generate a noise signal.

Next, at block 5002, the noise signal is fed to a signaling line of the respective sensor. Thereby, a superimposed signal can be formed which includes, both, a sensor signal indicative of a physical observable measured by the sensor and the noise signal.

In the scenario of FIG. 2, a signal generator is operated to generate the noise signal. However, in other scenarios, it would also be possible that the noise signal is not generated by operating a signal generator; but rather intrinsically generated by interaction with an environment of the sensor. Hence, the noise signal may be inherently present due to environmental influences such as interference, crosstalk, thermal effects, etc.

According to various examples, it would be possible that, at 5001, the noise signal is generated based on a cryptographic key. For example, a pseudorandom signal may be generated as the noise signal, dependent on the cryptographic key. A spread-band signal can be generated.

According to various scenarios, flexible operation of the signal generator generating the noise signal is possible. For example, it would be possible that a configuration of the signal generator is set based on a sensor signal of the sensor. For example, the configuration may facilitate reduced crosstalk or interference between the sensor signal and the noise signal. This may be achieved by selecting the configuration appropriately. The configuration may include a signal level of the noise signal. The configuration may include a frequency spectrum of the noise signal. Then, appropriate filtering may be implemented at an analog-digital-converter. Filtering may be implemented in accordance with noise cancellation, e.g., at the interface of the control unit 111. For example, a bandpass filter, a low-pass filter, or a high-pass filter may be implemented.

To facilitate such separation of the components of the superimposed signal, it would be possible that the method according to FIG. 2 further includes transmitting configuration data which is indicative of a configuration of the signal generator. Based on such configuration data, it is then possible to implement noise cancellation techniques. Also, analysis of the noise signal can be accurately implemented. For example, by flexibly adjusting the generation of the noise signal from time to time, freshness can be provided, thereby mitigating attack vectors such as replay attacks.

FIG. 3 is a flowchart of a method according to various examples. For example, the method according to FIG. 3 may be executed by the analysis unit 121 according to the scenario of FIG. 1, e.g., by the control circuitry of the analysis unit 121.

At block 5011, a noise signal is established. There are different techniques available for establishing the noise signal at 5011. For example, the noise signal may be read out from an analog signaling line of the sensor, e.g., using inductive readout. Such a scenario facilitates simple retrofit because such readout of the noise signal can be implemented without modifying the signaling line or the sensor or the control unit. Then, existing systems do not have to pass functionality tests, etc., because existing components such as the sensor, the signaling line and the control unit are not affected by the readout. This can be particularly relevant for safety monitoring systems, because in such a scenario the detecting of the noise signal and the analysis of the noise signal is not required to be part of safety-certified routines. On the other hand, particularly for safety monitoring system, there is a continued need for verifying sensors signals against modification of the sensor and/or the signaling line.

In another example implementation of block 5011, it is not required that the noise signal is detected by corresponding logic of the analysis unit executing the method of FIG. 3. Rather, it would be possible to receive control data which digitally encodes the noise signal, e.g., from the control unit configured to process the sensor signal. This may be helpful where the control unit is already configured to detect the noise signal by implementing noise cancellation for separating the sensor signal from the noise signal in the superimposed signal. Then, such functionality may be re-used to establish the noise signal.

Next, at block 5012, an analysis of the noise signal is performed. This may, e.g., include checking a match between the noise signal and a reference signal. As a general rule, the analysis at block 5012 can rely on various reference techniques, e.g., statistic analysis such as analysis of the power spectral density, anomaly detection, fingerprint extraction, pattern detection, spectral analysis, machine learning, etc.

In some scenarios, it would be possible that the method further includes receiving configuration data which is indicative of a configuration of the signal generator configured to generate the noise signal, cf. FIG. 2: block 5001. Then, the analysis of block 5012 and/or the establishing of the noise signal of block 5011 may be implemented based on the configuration data. For example, the configuration data may facilitate seperation of the noise signal from other components of a superimposed signal. For example, by flexible adjusting the generation of the noise signal, freshness can be provided, thereby mitigating attack vectors such as replay attacks.

In a simple scenario, the result of the analysis at block 5012 is indicative of a YES/NO-discrimination with respect to successful verification of the sensor signal. In other scenarios, more information regarding the result of the analysis may be available. The result of the analysis may be provided at a higher level of detail. For example, the result of the analysis may be classified. Here, respective categories may be predefined for the classification. Example categories discriminate with respect to level of criticality of the modification such as low-severity manipulation vs. high-severity manipulation, type of deviation from the reference signal, failure of the sensor vs. failure of the signaling line, manipulation of the sensor vs. manipulation of the signaling line, etc.

Thus, as a general rule, a classification of the result of the analysis may be performed with respect to a plurality of categories. Then, the check data can be indicative of the classification. This helps to tailor countermeasures implemented at the control unit, e.g., if verification of the sensor signal fails. For example, depending on the severity of the failed verification, different countermeasures may be implemented—e.g., a graphical user interface may be controlled to display a warning message in less severe scenarios or an emergency stop of a controlled system may be implemented in more severe scenarios.

At 5013, check data indicative of the result of the analysis is transmitted. For example, the check data can be transmitted to the control unit 111 (cf. FIG. 1). The check data may be indicative of the classification of the result of the analysis.

The check data may facilitate countermeasures if the sensor signal could not be verified. For example, the check data may trigger disabling the corresponding sensor. For example, the check data may include a warning message such that the control unit can take appropriate countermeasures.

It would be possible that the check data includes a cryptographic key. The cryptographic key may be used at the control unit 111. The cryptographic key can then be used by the control unit 111 for at least one or more of the following: decrypting; encrypting; calculation of a signature; verification of a signature; key instantiation. The check data may selectively include the cryptographic key, depending on the result of the analysis. For example, if the analysis is indicative of modification of the sensor and/or the signaling line, then the cryptographic key may not be included in the check data.

Alternatively or additionally to transmitting the check data to the control unit, it would also be possible to transmit the check data to a server of a backend system. For example, this may be implemented based on a cellular communication connection. Blacklisting may be implemented. A safety control device may be provided with the check data.

FIG. 4 illustrates a method according to various examples. For example, the method according to the scenario of FIG. 4 may be executed by the control unit 111 of the scenario of FIG. 1, e.g., by respective control circuitry of the control unit 111.

At block 5021, a sensor signal is received. For example, at block 5021, a superimposed signal including the sensor signal and a noise signal may be received. Then, based on noise cancellation techniques, the sensor signal may be extracted. The sensor signal may be received via a signaling line of a corresponding sensor. The sensor signal may be received in digital domain or analog domain. As such, block 5021 may include an analog-digital-conversion.

Next, at block 5022, check data is received. The check data is indicative of a result of an analysis of a noise signal on the signaling line. As such, block 5022 may be interrelated with block 5013.

At block 5023, it is checked whether the integrity of the sensor signal received at block 5021 has been verified by means of the check data. Hence, depending on the check data, the sensor signal is either processed at block 5024; or not processed at block 5025.

Processing at block 5024 may involve using a cryptographic key included in the check data. This increases a level of security by mitigating attack vectors which attempt to circumvent reception of the check data.

Figure 5:
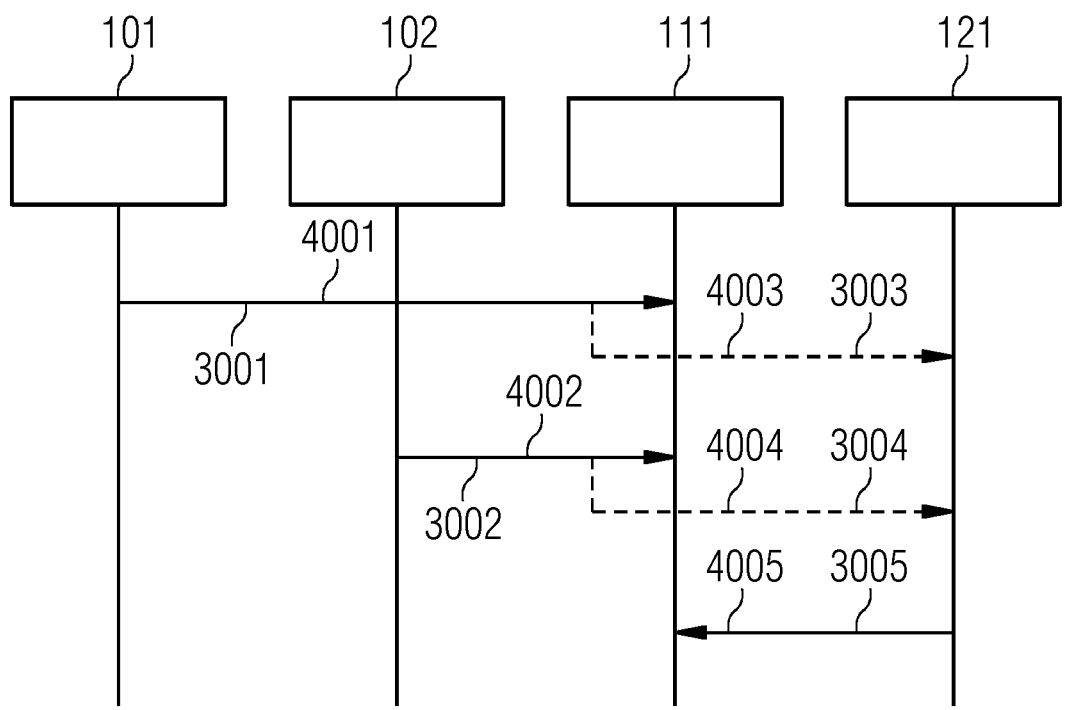
FIG. 5 is a signaling diagram illustrating communication between multiple sensors, the control unit and the analysis unit according to various examples.

FIG. 5 is a signaling diagram illustrating communication between the sensors 101, 102, the control unit 111, and the analysis unit 121 according to various examples.

At 4001, a sensor signal 3001 is transmitted by the sensor 101 and received by the control unit 111. At 4002, a sensor signal 3002 is transmitted by the sensor 102 and received by the control unit 111.

The sensor signals 3001, 3002 may be included in respective superimposed signals which also include noise signals.

At 4003, a noise signal 3003 is read out from the communication between the sensor 101 and the control unit 111 and received by the analysis unit 121. Likewise, at 4004, a noise signal 3004 is read out from the communication between the sensor 102 and the control unit 111 and received by the analysis unit 121.

The analysis unit 121 can then perform an analysis of the noise signals 3003, 3004 and transmit corresponding check data 3005 at 4005.

Figure 6:
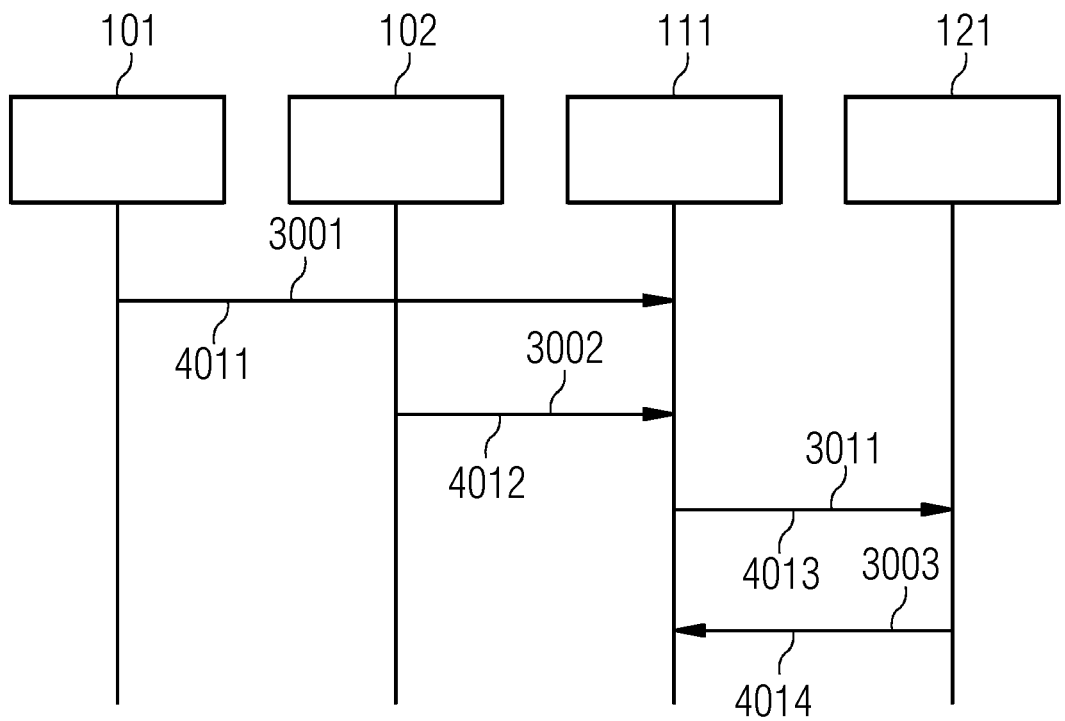
FIG. 6 is a signaling diagram illustrating communication between multiple sensors, the control unit and the analysis unit according to various examples.

FIG. 6 is a signaling diagram of communication between the sensor 101, the sensor 102, the control unit 111, and the analysis unit 121.

4011 generally corresponds to 4001. 4012 generally corresponds to 4002.

At 4013, control data 3011 digitally encoding the noise signal is transmitted by the control unit 111 and received by the analysis unit 121.

Again, the analysis unit 121 can then perform the analysis of the noise signal and, at 4014, transmit the check data 3003 to the control unit 111.

FIG. 7 illustrates aspects with respect to the system 100. The scenario of FIG. 7 generally corresponds to the scenario of FIG. 1. In the scenario of FIG. 7, the system 100 includes sensors 101-104 with associated signaling lines 105-108. In FIG. 7, the interface 115 and the control circuitry 116 of the control unit 111 is illustrated.

FIG. 8 illustrates aspects with respect to the system 100. In the scenario of FIG. 8, the analysis unit 121 is configured to detect the noise signal 3003, 3004 based on inductive readout 201 on the signaling lines 105-108. In the scenario of FIG. 8, the control unit 111 further comprises a safety circuitry 117, which is generally optional. The interface 115, the control circuitry 116, and the safety circuitry 117 can all receive the check data; in other scenarios, it would be possible that only some of the components 115-117 receive the check data.

From a comparison of FIGS. 7 and 8 it follows that it is possible to retrofit the verification functionality without having to modify the signaling lines 105-108, the sensors 101-104, and the control unit 111.

In the scenario of FIG. 8, the analysis unit 121 is connected to a server 132 of a backend system via an open network 131 such as the Internet or an office network. Alternatively or additionally to transmitting the check data to the control unit 111, it would be possible that the analysis unit 121 transmits the check data to the server 131 to take appropriate countermeasures.

FIG. 9 illustrates aspects with respect to the analysis unit 121. For example, the analysis unit 121 can be implemented as hardware security module (HSM). For example, the HSM can be implemented as extension module to an industry PC (IPC), connectable via RS 232, PCIE, SPI or USB with the IPC. The analysis unit 121 can be implemented at the HSM in software on a central processing unit or microcontroller, and/or in hardware, e.g., by means of an FPGA. In a preferred scenario, a system-on-chip is used, e.g., a temper-protected control circuitry 116.

In the scenario of FIG. 9, a random access memory 121 is coupled via bus encryption 124 with respective control circuitry 127. Flash memory 123 is coupled via a FLASH controller 125 with the control circuitry 127. An interface 128 is provided which facilitates the inductive readout 201 and/or may optionally receive an alarm signal 3091. Encrypted writing and/or reading of the random access memory 122 and/or the FLASH memory 123 is possible. An interface 126 is configured to provide the check data 3003 to the control unit 111. For example, a reference signal subject to a comparison with the noise signal can be stored in the flash memory 123.

The analysis unit 121 can then confirm—e.g., by means of a cryptographic checksums such as a digital signature, a message authentication code, etc.—that the noise signal matches a reference signal, and, hence, an a-priori assumption. Thereby, it is possible to verify the corresponding sensor signal which is communicated on the respective signaling lines 105-108 and which is typically superimposed with the noise signal.

In one option, the analysis unit 121 stores a cryptographic key and selectively transmits the cryptographic key as part of the check data 3003 to the control unit 111. The cryptographic key can then be used by the control unit 111 for at least one or more of the following: decrypting; encrypting; calculation of a signature; verification of a signature; key instantiation. The use of the cryptographic key is enabled if the verification of the sensor signal based on the analysis of the noise signal provides a positive result. In a further option, the cryptographic key is deleted in response to failed verification of the sensor signal.

FIG. 10 schematically illustrates aspects with respect to the analysis unit 121. The scenario of FIG. 10 generally corresponds to the scenario of FIG. 9. However, in the scenario of FIG. 10, the noise signal 3011 is not obtained using inductive readout 201; rather, control data 3011 is generated by the interface 115 of the control unit 111, e.g., by an analog-digital-converter of the interface 115. The control data digitally encodes the noise signal which is detected by the interface 115. Then, the control data is transmitted by the control unit 111 and received by the analysis unit 121. As such, the scenario of FIG. 10 generally corresponds to the scenario of FIG. 6.

Summarizing, above, techniques of verifying the integrity of a sensor signal have been described. Based on the described techniques, a retrofit of existing systems including one or more sensors under control unit with the verification functionality becomes possible. This is achieved in some examples by providing a separate analysis unit.

The technique can be applied, e.g., to physically remote sensors. Here, it can be possible to implement the readout, e.g., an inductive readout, in proximity of the control unit.

The techniques described herein have the advantage that safety-critical apparatuses relying on processing of the sensor signal by the control unit do not have to be re-certified once the verification functionality has been retrofitted; this is because the existing system of the one or more sensors and the control unit is typically not required to be modified or modified significantly. An additional certification is not required.

The techniques described herein have particular advantages if compared to reference implementations where sensors and/or signaling lines are deployed in protected environments, e.g., access-controlled and alarm-secured cable funnels. Thus, the hardware complexity is significantly reduced.

Although the present invention has been disclosed in the form of preferred embodiments and variations thereon, it will be understood that numerous additional modifications and variations could be made thereto without departing from the scope of the invention.

For the sake of clarity, it is to be understood that the use of 'a' or 'an' throughout this application does not exclude a plurality, and 'comprising' does not exclude other steps or elements.

The invention claimed is:

1. A method of verifying the integrity of a sensor signal, comprising:
   establishing, by an analysis unit, a noise signal on a signaling line of a sensor,
   performing, by the analysis unit, an analysis of the noise signal,
   transmitting, by the analysis unit, check data, wherein the check data includes an indication of a result of the analysis, and wherein the check data includes a cryptographic key,
   receiving, by a control unit, a sensor signal on the signaling line of the sensor,
   receiving, by the control unit, the check data, and
   depending on the check data: selectively processing, by the control unit, the sensor signal,
   wherein the cryptographic key is required to process the sensor signal.

2. The method of claim 1, wherein said establishing of the noise signal comprises detecting the noise signal using inductive readout of the signaling line.

3. The method of claim 1, wherein said establishing of the noise signal comprises receiving control data digitally encoding the noise signal.

4. The method of claim 1, further comprising:
   classifying the result of the analysis with respect to a plurality of categories,
   wherein the check data includes a classification category selected from the plurality of categories.

5. The method of claim 4, wherein the plurality of categories comprise one or more of: manipulation of the sensor; manipulation of the signaling line; non-critical manipulation; critical manipulation; failure of the sensor; and failure of the signaling line.

6. The method of claim 1, further comprising:
   receiving configuration data indicative of a configuration of a signal generator configured to generate the noise signal, wherein at least one of said establishing and said performing of the analysis is based on the configuration data.

7. The method of claim 1, wherein the analysis comprises at least one of: a comparison of the noise signal with a predefined reference signal; an anomaly detection; and a spectral analysis.

8. The method of claim 1, further comprising:
   detecting the noise signal, and
   transmitting control data digitally encoding the noise signal.

9. The method of claim 1, further comprising:
   deleting the cryptographic key associated with said selectively processing the sensor signal based on the result of the analysis.

10. A system for verifying the integrity of a sensor signal, the system comprising:
    an analysis unit comprising control circuitry configured for:
       establishing a noise signal on a signaling line of a sensor,
       performing an analysis of the noise signal, and
       transmitting check data, wherein the check data includes an indication of a result of the analysis,
       wherein the check data also includes a cryptographic key,
       wherein the cryptographic key is required to process the sensor signal; and
    a control unit comprising control circuitry configured for:
       receiving a sensor signal on the signaling line of the sensor,
       receiving the check data, and
       depending on the check data: selectively processing the sensor signal.

11. The system of claim 10, wherein said establishing of the noise signal comprises at least one of detecting the noise signal using inductive readout of the signaling line and receiving control data digitally encoding the noise signal.

12. The system of claim 10, wherein the control circuitry of the analysis unit is further configured for:
classifying the result of the analysis with respect to a plurality of categories,
wherein the check data includes a classification category selected from the plurality of categories.

13. The system of claim 12, wherein the plurality of categories comprise one or more of: manipulation of the sensor; manipulation of the signaling line; non-critical manipulation; critical manipulation; failure of the sensor; and failure of the signaling line.

14. The system of claim 10, wherein the control circuitry of the analysis unit is further configured for:
receiving configuration data indicative of a configuration of a signal generator configured to generate the noise signal,
wherein at least one of said establishing and said performing of the analysis is based on the configuration data.

15. The system of claim 10, wherein the analysis comprises at least one of: a comparison of the noise signal with a predefined reference signal; an anomaly detection; and a spectral analysis.

\* \* \* \* \*